United States Patent
Wasa et al.

(10) Patent No.: US 10,749,082 B2
(45) Date of Patent: Aug. 18, 2020

(54) METHOD OF MANUFACTURING LIGHT EMITTING DEVICE AND LIGHT EMITTING DEVICE

(71) Applicant: NICHIA CORPORATION, Anan-shi, Tokushima (JP)

(72) Inventors: Takuya Wasa, Kaifu-gun (JP); Shinya Kondo, Itano-gun (JP); Takenori Kumakura, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 16/288,024

(22) Filed: Feb. 27, 2019

(65) Prior Publication Data

US 2019/0267520 A1    Aug. 29, 2019

(30) Foreign Application Priority Data

Feb. 28, 2018  (JP) .................................. 2018-035596
Feb. 19, 2019  (JP) .................................. 2019-027346

(51) Int. Cl.

| H01L 33/54 | (2010.01) |
| H01L 25/075 | (2006.01) |
| H01L 33/50 | (2010.01) |
| H01L 33/58 | (2010.01) |

(Continued)

(52) U.S. Cl.
CPC .............. *H01L 33/54* (2013.01); *B29C 39/24* (2013.01); *B29D 11/00326* (2013.01); *H01L 25/0753* (2013.01); *H01L 33/501* (2013.01); *H01L 33/58* (2013.01); *H01L 2933/005* (2013.01);

(Continued)

(58) Field of Classification Search
None
See application file for complete search history.

(56) References Cited

U.S. PATENT DOCUMENTS

2007/0195534 A1 * 8/2007 Ha ..................... B29C 33/005
                                                              362/327
2010/0259706 A1   10/2010 Kuwaharada et al.
2010/0270907 A1   10/2010 Yamaguchi et al.
(Continued)

FOREIGN PATENT DOCUMENTS

EP    2 518 395 A2   10/2012
JP    H05-226392 A    9/1993
(Continued)

*Primary Examiner* — Herve-Louis Y Assouman
(74) *Attorney, Agent, or Firm* — Foley & Lardner LLP

(57) ABSTRACT

A method of manufacturing a light emitting device includes: providing a substrate and a plurality of light sources disposed on the substrate; and forming a plurality of sealing members, each covering a respective one of the plurality of light sources, by supplying a sealing material onto the substrate through a plurality of nozzles of a discharge device. The step of forming the plurality of sealing members includes: performing a first forming step, in which at least one of the sealing members is formed such that a portion of the sealing material is retained dangling from a respective at least one of the plurality of nozzles as at least one dangling thread portion, and successively performing a second forming step, which is started while the at least one dangling thread portion of the sealing material is retained dangling from the at least one of the plurality of nozzles of the discharge device.

8 Claims, 13 Drawing Sheets

(51) Int. Cl.
 *B29C 39/24* (2006.01)
 *B29D 11/00* (2006.01)
(52) U.S. Cl.
 CPC ............... *H01L 2933/0033* (2013.01); *H01L 2933/0058* (2013.01)

(56) References Cited

U.S. PATENT DOCUMENTS

| | | |
|---|---|---|
| 2011/0101397 A1 | 5/2011 | Yuh et al. |
| 2012/0299017 A1 | 11/2012 | Chen et al. |
| 2013/0161671 A1 | 6/2013 | Hsu et al. |
| 2013/0161672 A1 | 6/2013 | Hsieh |
| 2013/0300285 A1 | 11/2013 | Ito |
| 2014/0061699 A1* | 3/2014 | Kim ............... F21V 7/0091 257/98 |
| 2016/0076732 A1 | 3/2016 | Kim |
| 2016/0190405 A1 | 6/2016 | Yamada et al. |
| 2016/0265741 A1 | 9/2016 | Yamada et al. |
| 2017/0012188 A1 | 1/2017 | Park et al. |
| 2017/0066005 A1 | 3/2017 | Ikushima |
| 2018/0215113 A1 | 8/2018 | Yamada et al. |
| 2018/0301603 A1 | 10/2018 | Yamada et al. |

FOREIGN PATENT DOCUMENTS

| | | |
|---|---|---|
| JP | H07-122585 A | 5/1995 |
| JP | H08-083869 A | 3/1996 |
| JP | 2004-025121 A | 1/2004 |
| JP | 2008-034443 A | 2/2008 |
| JP | 2013-065641 A | 4/2013 |
| JP | 2014-049440 A | 3/2014 |
| JP | 2016-154204 A | 8/2016 |
| JP | 2016-171227 A | 9/2016 |
| WO | WO-2009/157166 A1 | 12/2009 |
| WO | WO-2012/099145 A1 | 7/2012 |
| WO | WO-2014/042318 A1 | 3/2014 |
| WO | WO-2015/137271 | 9/2015 |

\* cited by examiner

METHOD OF MANUFACTURING LIGHT EMITTING DEVICE AND LIGHT EMITTING DEVICE

CROSS-REFERENCE TO RELAYED PATENT APPLICATIONS

The present application claims priority under 35 U.S.C. § 119 to Japanese Patent Application No. 2018-035596, filed on Feb. 28, 2018, and Japanese Patent Application No. 2019-027346, filed on Feb. 19, 2019. The contents of these applications are incorporated herein by reference in their entireties.

BACKGROUND

The present disclosure relates to a method of manufacturing a light emitting device and a light emitting device. In particular, the present disclosure relates to a method of manufacturing a light emitting device that includes a sealing member that covers a light source, and to a light emitting device obtained by the method.

Light emitting diodes (LEDs) generally can emit light with high luminance at low-power, and have longer operational life, and thus have been suitably used as light emitting elements. Light emitting devices that employ such light emitting elements as their light sources have been in practical use, for example, in general lighting fixtures and backlights.

The light emitting elements employed in the light emitting devices are generally covered by a covering member. It has been proposed to realize a so-called "batwing" light distribution by a shape of sealing member, for example, in Japanese Patent Publication Nos. 2016-171227 and 2016-154204.

SUMMARY

While, reduction in the thickness or the like has been demanded for the light source devices, efficient manufacturing has also been important.

In manufacturing light emitting devices having a plurality of light-emitting parts, a sealing member is supplied through a discharge device to form sealing members, each corresponding to one of the plurality of light-emitting parts. In order to form such a plurality of sealing members, a material of the sealing members is sequentially supplied onto a substrate. The discharge device is therefore needed to be moved to form each of successive sealing members, which requires addition of moving time of the discharge device in the manufacturing time. In particular, the discharge device is needed to be moved not only in a horizontal direction but also in a vertical direction while forming each of the sealing members, and also, the supply of the sealing material is needed to be suspended or resumed. Thus, the overall time required for performing sealing material forming multiple times is not negligible.

That is, further enhancement of efficiency has been demanded in manufacturing a light-emitting device in which a plurality of sealing members are formed by sequentially supplying a sealing material through the discharge device.

Under these circumstances, the present disclosure has been developed. One object of certain embodiments of the present disclosure is to provide a method of manufacturing light emitting devices with higher efficiency in terms of forming a plurality of sealing members.

Not following existing techniques, the present inventors have developed a new approach and have devised a method of manufacturing that can achieve the object.

According to one embodiment of the present disclosure, a method of manufacturing a light emitting device that includes a substrate, a plurality of light sources disposed on the substrate, and a plurality of sealing members each covering a respective one of the plurality of light sources, the method includes: providing a substrate having a plurality of light sources disposed on the substrate; supplying a sealing material onto the substrate through a plurality of nozzles of a discharge device to form a plurality of sealing members each covering a respective one of the plurality of light sources; the forming the plurality of sealing members including performing a first forming and a second forming, the second forming being performed successive to the first forming. In the performing the first forming, the sealing member is formed while retaining a portion of the sealing material dangling from each of the plurality of nozzles as a dangling thread portion, and the second forming is started with the dangling thread portions of the sealing material being retained dangling from each of the plurality of nozzles of the discharge device.

According to the method of manufacturing a light-emitting device according to the present disclosure, a plurality of sealing members can be formed more efficiently.

More specifically, the method of manufacturing according to the present disclosure utilizes dangling thread portions to allow more efficient formation of the sealing members of the light-emitting parts that is to be successively performed. The dangling thread portions are provided prior to performing each of the successive formations of the sealing members, where the presence of the dangling thread portions allows for swifter starting of each of the successive formations of the sealing members.

Further specifically, the presence of the dangling thread portions allows for a reduction in a vertical moving distance of the discharge device between sealing member forming operations such that successive formations of the sealing members can respectively be started in a shorter required time. In other words, a time required between formation of a first sealing member and successive formation of a second sealing member can be reduced, and thus the plurality of sealing members can be formed in a shorter time.

Moreover, in the method of manufacturing according to the present disclosure, the dangling thread portions are suspended from the discharge device, which allows for swifter and more precise supply of the sealing material using of the discharge device. In conventional methods, discharge devices generally employ small diameter nozzles, which may result in jetting out of the sealing material from the nozzles when starting discharge. That is, the sealing material tends to be scattered at the beginning of supply. Contrary to this, in the present method, dangling thread portions are left dangling from the nozzles of the discharge device and successive discharge of the sealing material is started through the dangling thread portions, such that the sealing material can be supplied more smoothly to the substrate. Moreover, according to the present disclosure, discharging of the sealing material is performed through the dangling thread portions that have been already exposed from the nozzles, such that discharging of the sealing material as jets from the nozzles may barely occur. Thus, more precise start of supplying the sealing material can be achieved.

DETAILED DESCRIPTION OF THE EMBODIMENTS

Figure 1:
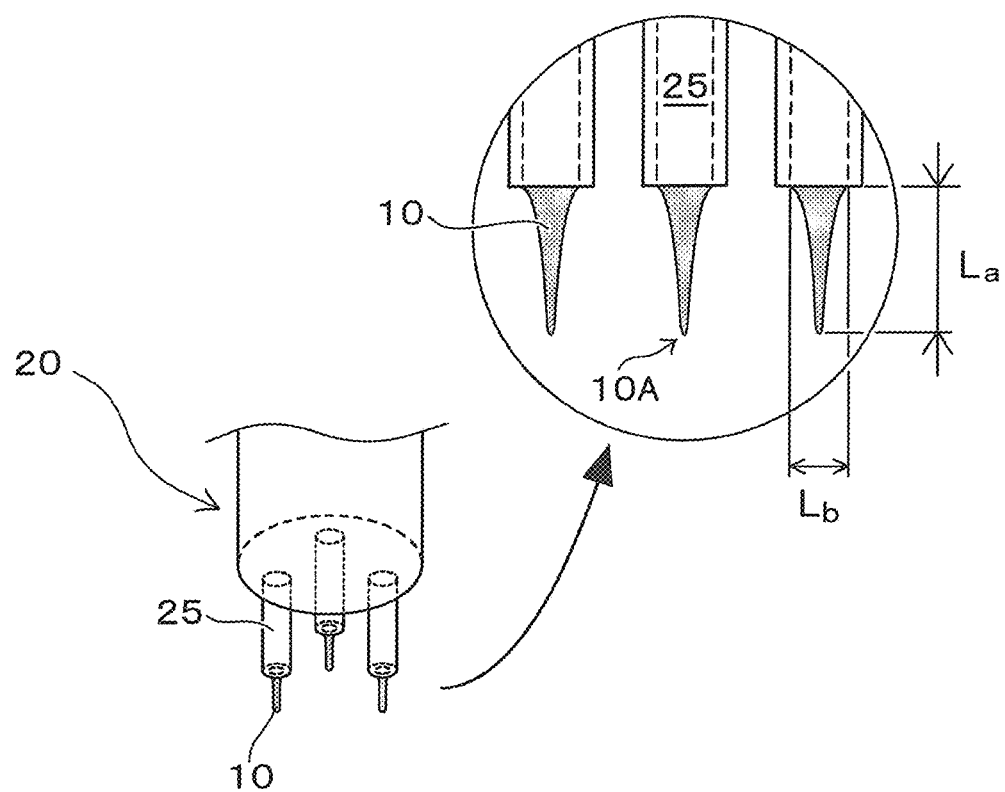
FIG. 1 is a schematic perspective view and a partially enlarged schematic cross-sectional view showing dangling thread portions.

A method of manufacturing and a light emitting device obtained according to the method will be described in detail below. Description will be made below with reference to the accompanying drawings. The drawings are provided for illustrative purposes only, and therefore, the appearances and the sizes of the components in the drawings may differ from those in actual structures.

Terms such as "upward/downward direction" and "right/left direction" used directly or indirectly in the present specification respectively correspond to the upward/downward direction and the right/left direction in the figures. Unless otherwise specified, the same reference numerals or symbols indicate the same or similar members or meaning. In certain embodiments, a vertically downward direction (i.e., the direction of gravity) can correspond to "downward direction" and the opposite direction can correspond to an "upward direction". Then, a direction perpendicular to the "upward/downward direction" can correspond to horizontal direction, i.e., to the "right/left direction".

In the present specification, the term "cross-sectional view" corresponds to a virtual cross-section taken along line in a thickness direction of the light emitting part or the light emitting device. In other words, the term "cross-sectional view" corresponds to a schematic cross-sectional view taken along line perpendicular to a principal surface of the substrate on which the light emitting part is disposed. The term "plan view" used in the present specification corresponds to a schematic view of an object seen from an upper side or a lower side along the direction of its thickness.

Method of Manufacturing Light Emitting Device

A method of manufacturing a light emitting device that has a plurality of light-emitting parts on a substrate according to certain embodiments of the present disclosure will be described below. The method includes the use of a discharge device in forming a plurality of sealing members, each corresponding to a respective one of the plurality of light-emitting parts. In particular, a sealing material used to form the sealing members is kept in a certain state between forming a first sealing member of a first light emitting part and successively forming successive a second sealing member of a second light emitting part.

More specifically, when the sealing material is supplied onto the substrate through a plurality of nozzles of a discharge device to form a plurality of sealing members, each covering a light source of a respective one of the plurality of light emitting parts, the method according to the present disclosure includes forming a first of the plurality of the sealing members to cover a light source of a respective first of the plurality of light emitting parts (a first forming), and successive forming a second of the plurality of the sealing members to cover a light source of a second of the plurality of light emitting parts (a second forming). The second forming is performed successively to the first forming, and in the first forming, the sealing material is retained dangling from each of the plurality of nozzles, as a dangling thread part.

In the present specification, "the first forming" and "the second forming" refer to forming the sealing members covering different light-emitting parts. The light-emitting parts obtained through the first forming of the sealing members and the light-emitting parts obtained through the second forming of the sealing members are distinct to each other. In brief, the first forming and the second forming are not performed on the same light source but are performed on different light sources. In other words, a single light source is covered by the sealing member that is applied through a single forming of either the first forming or the second forming.

In the present specification, the term "substrate" refers to a member of the light emitting device provided to mount the light emitting parts. The substrate used in the method of manufacturing according to the present disclosure is preferably a substrate having a light source of the light emitting part provided thereon. That is, when a discharge device is used to dispose the sealing member, it is preferable that the substrate has been provided with a light source of the light emitting part, which is preferably a plurality of light sources, each corresponding to a respective one of the plurality of light emitting parts. In certain preferable embodiments, a plurality of light sources are disposed in an array on one principle surface of the substrate. For example, such a plurality of light sources are aligned at least in one direction and/or disposed at a substantially constant interval. Further, in the method of manufacturing according to certain embodiments of the present disclosure, the substrate that has provided with a single or a plurality of light sources and corresponding electrically conductive wirings to supply electric power to the light source(s) may be used.

In the present specification, the term a "light source" refers to a member configured to emit light and having an appropriate shape and/or structure. For example, the light source may be a light emitting element, typically a light-emitting diode, or maybe of a combination of a light emitting element and a wavelength converting member (for example, a light-emitting diode package). In the present specification, the term a "wavelength converting member" refers to a member configured to convert the wavelength of a portion or entire of the light emitted from the light emitting element, and examples thereof include a fluorescent material.

The dangling thread portions provided in a method of manufacturing according to certain embodiments of the present disclosure are formed by leaving a sealing material dangling downward from the discharge device, and particularly, such that the sealing material dangling downward from the discharge device is available for use in successively forming a sealing member of a light-emitting part (depositing second sealing member). Accordingly, the successive formation of sealing member can be more quickly started. In the present specification, the term "sealing material" refers to a raw material of a sealing member that covers the light source of the light-emitting part, and particularly refers to a fluid raw material, which is preferably in a paste state. The sealing material is electrically insulating and allows transmittance of the light emitted from the light source (for example, a transmittance of 70% or greater), and may have fluidity before solidified (for example, before completely cured). More specifically, the sealing material may contain a resin material (for example, a curable resin material), and in such a case, the dangling thread portions may be referred to as "resin threads", "stringing resin threads", or the like. Examples of the resin material include silicone resin, epoxy resin, phenol resin, polycarbonate resin, acrylic resin, TPX resin, polynorbornene resin, or modified resin thereof or hybrid resin thereof. Of those, silicone resin is preferable because of its good heat-resisting properties and/or good light-resisting properties. In the present specification, "silicone resin" refers to "silicone-based resin" that includes modified silicone resin or resin that at least includes a silicone matrix. Such a sealing material may additionally contain a filler material and/or a fluorescent material.

The term "dangling thread portions" in the present specification refers to, in a broad sense, portions of sealing material dangling downward from the discharge device, and to, in a narrow sense, portions of sealing material dangling downward from the nozzles of the discharge device. As shown in FIG. 1, the dangling thread portions 10 according to certain embodiments at least have vertical dimensions $L_a$ greater than horizontal dimensions $L_b$ (if a dangling thread portion has varying dimensions in horizontal direction, the maximum dimension thereof). For example, the vertical dimension $L_a$ may be 1.5 times or greater, 2 times or greater, or 3 times or greater with respect to the horizontal dimension $L_b$. Preferably, the dangling thread portions 10 are in shapes gradually thinning toward respective ends as shown in FIG. 1, such that, for example, a vertically-lowermost end 10A of each of the dangling thread portions 10 may have a pointed shape.

Figure 2:
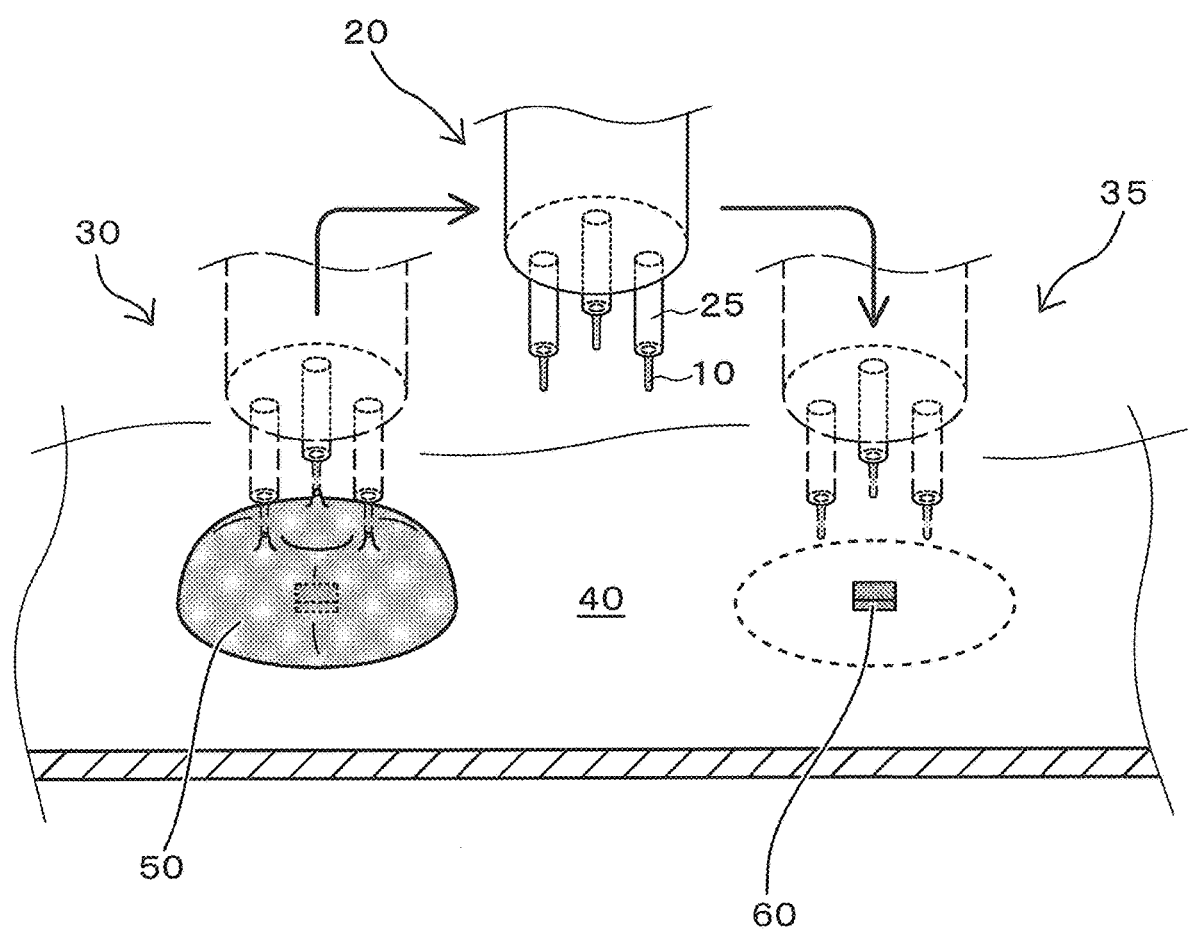
FIG. 2 is a schematic perspective view illustrating dangling thread portions that are retained for successive formation of another sealing member.

As shown in FIG. 2, in the first forming 30 (and also in each successive second forming 35) of the sealing members, portions of the sealing material are left dangling from each of the plurality of nozzles as the dangling thread portions 10. With this arrangement, the dangling thread portions 10 dangling from the nozzles of the discharge device 20 can be used for a successive second forming 35 of another plurality of sealing members. Preferably, each of the dangling thread portions 10 are kept dangling from each of the nozzles 25 of the discharge device 20 and start successive second forming of another plurality of sealing members for another light-emitting parts. That is, while maintaining the dangling thread portions formed in an immediately preceding forming of the sealing member, supply of the sealing material for successively forming another sealing member is started.

In the method according to certain embodiments of the present disclosure, the presence of the dangling thread portions allows for a shorter period of time to resume the supply of the sealing material that has been temporarily suspended, for successively forming another sealing member.

Figure 3:
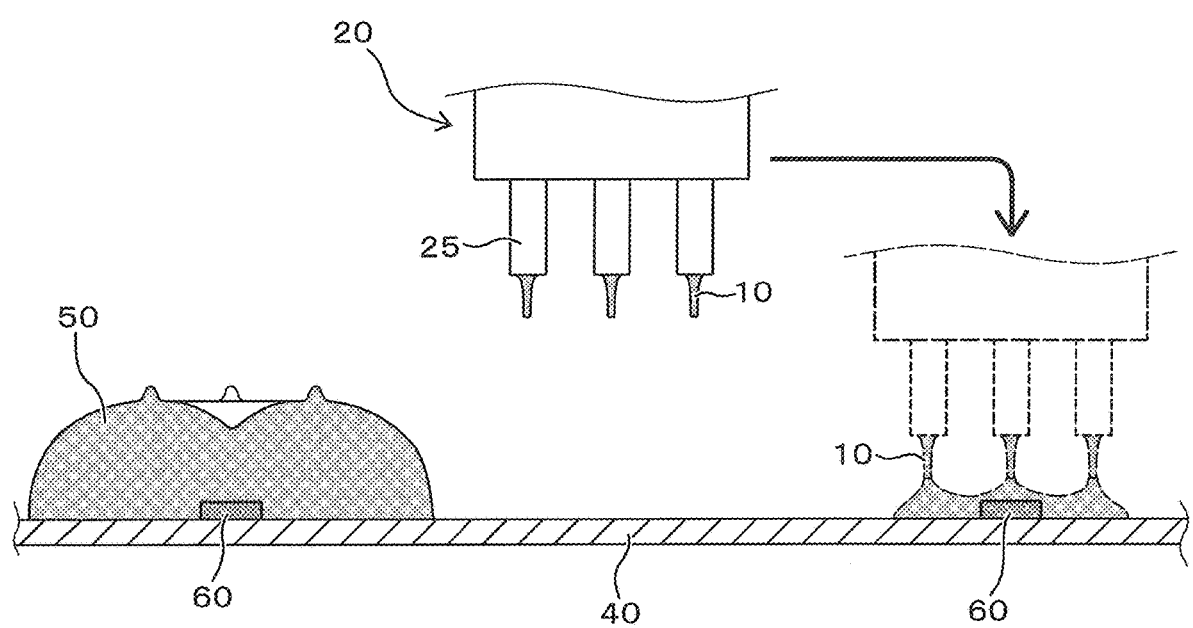
FIG. 3 is a schematic cross-sectional view illustrating lowering a discharge device to start supplying the sealing material.

The discharge device is moved to a predetermined desired position for a successive second forming 35 of another sealing member. At this time, as shown in FIG. 3, the discharge device 20 is preferably temporarily lowered before starting supplying the sealing material. For example, it is preferable that in an immediately preceding forming of one of the sealing members, the discharge device is gradually moved upward while supplying the sealing material, and in an immediately successive forming of another sealing member, the discharge device is moved in a horizontal direction and also is lowered in a vertical direction. That is, it is preferable that the discharge device is lowered as close as possible to the substrate before starting supplying the sealing material for the successive forming of another one of the sealing members. This is because with the discharge device brought as close as possible to the substrate, more precise discharge of the sealing material can be obtained, and accordingly, the sealing members can be formed with high accuracy.

In the embodiments of the present disclosure, dangling thread portions of the sealing material are formed such that the sealing material for an immediately successive sealing member can be applied through the tip ends of the dangling thread portions, which allows for a reduction in a distance of lowering the discharge device before start supplying the sealing material, as shown in FIG. 3. That is, with the presence of the dangling thread portions, the distance of vertically lowering the discharge device for successively forming another one of the sealing members can be reduced by the lengths of the dangling thread portions, which is indicated as a vertical dimension La in FIG. 1, such that the successive forming of another plurality of sealing members can be respectively started with a shorter required time. Accordingly, it becomes possible to reduce a required time to start a successive forming of another plurality of sealing members, and thus all of the plurality of sealing members can be formed in a shorter period of time. From such viewpoint, the greater the lengths of the dangling thread portions, the more preferable.

According to the method of manufacturing of the embodiments, the sealing material can be supplied through the tips of the dangling thread portions, which allows for a smoother and more precise start in supplying the sealing material. If the dangling thread portions are not formed and the sealing material is directly discharged from the nozzles of the discharge device, the sealing material may momentarily spurt out from the nozzles. It is thought that when the supply of the sealing material is temporarily stopped, portions of the sealing material staying in the nozzles in the nozzles without being exposed to the outside may act like plugs that hinder resuming the supply of the sealing material. The hindering to restart the supply have smaller apertures, and/or the sealing material has a higher viscosity.

In the present disclosure, the dangling thread portions are formed with portions of the sealing material that are contiguous to the sealing material in the nozzles and exposed from the nozzles, and thus reducing the hindering to restart the supply. This allows for a smoother and more precise start of supplying the sealing material. That is, according to the present disclosure, occurrence of spurting out of the sealing material from the nozzles as described above can be reduced or avoided and resuming the supply of the sealing material for a successive forming of the sealing member.

Figure 4:
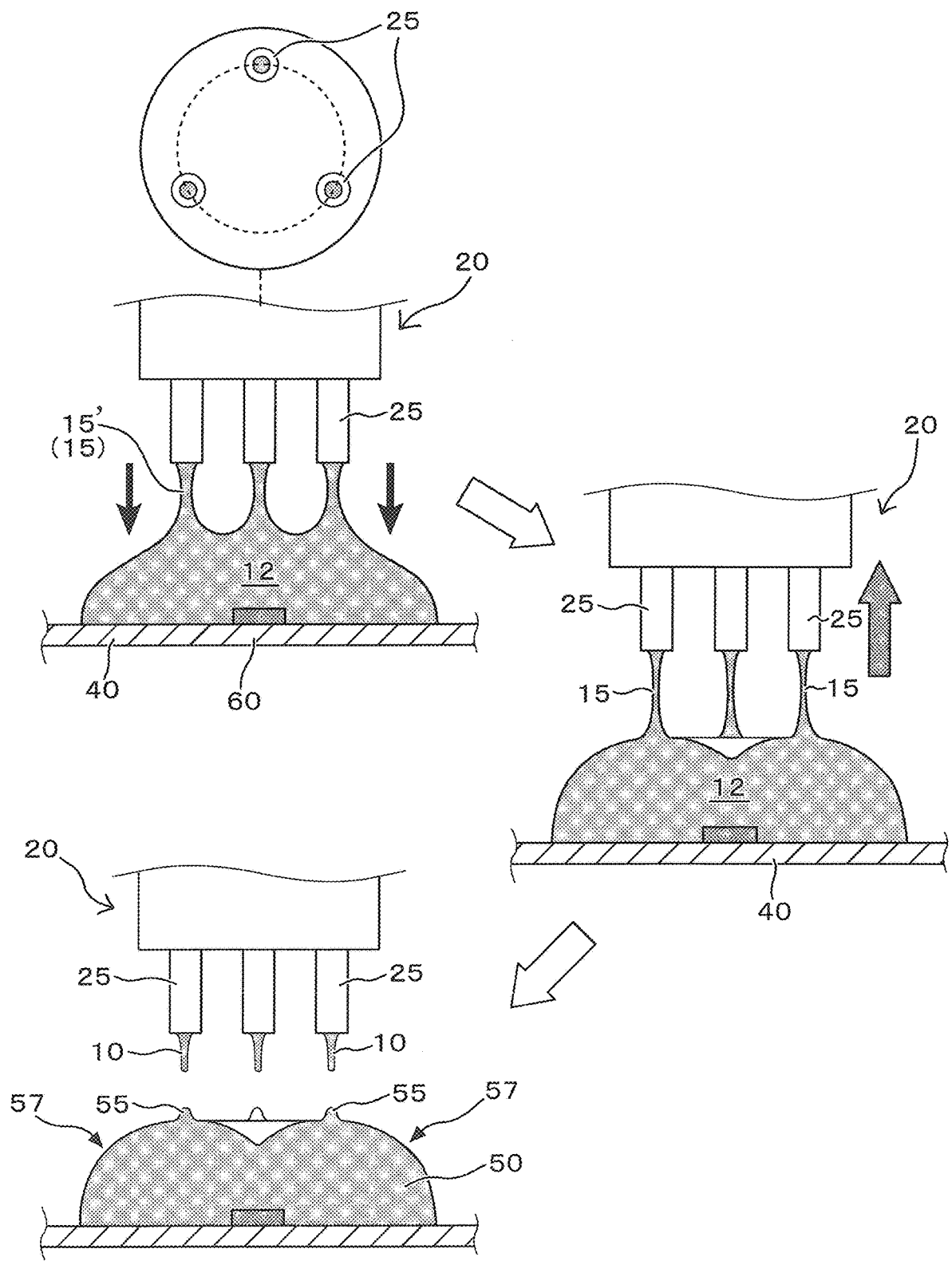
FIG. 4 is a schematic cross-sectional view illustrating an example of forming dangling thread portions.
Figure 5:
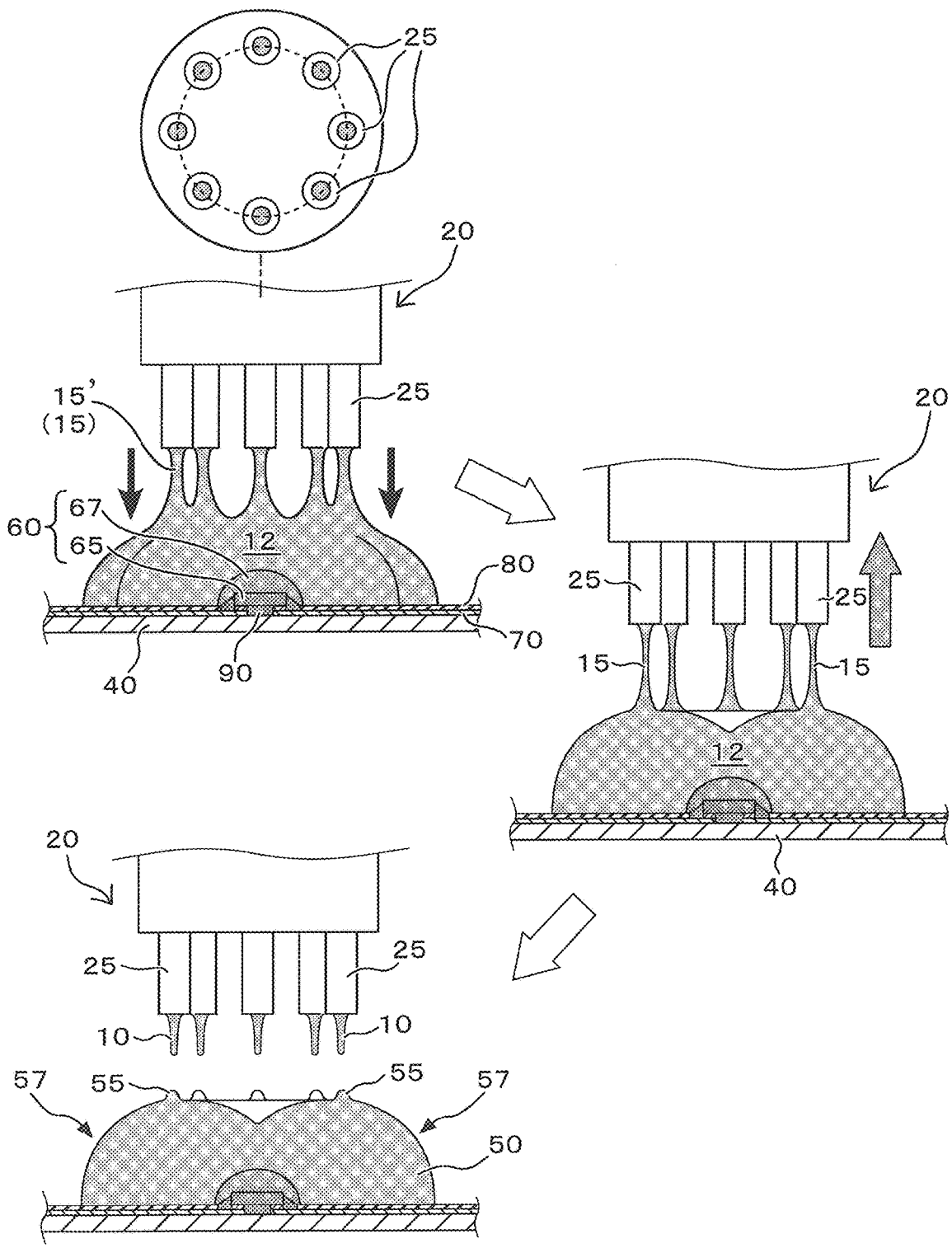
FIG. 5 is a schematic cross-sectional view more specifically illustrating an example of forming dangling thread portions.
Figure 6A:
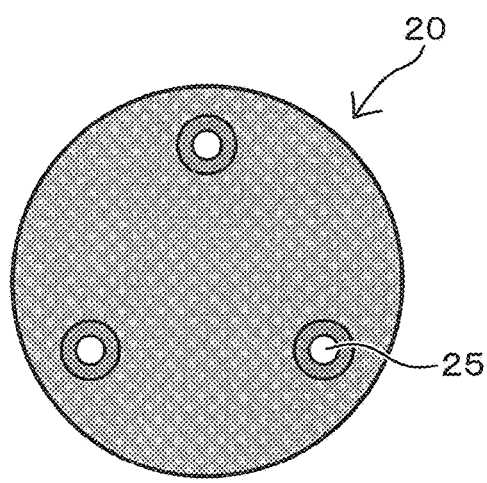
FIG. 6A is a schematic cross-sectional view showing an example of locating the nozzles of the discharge device.
Figure 6B:
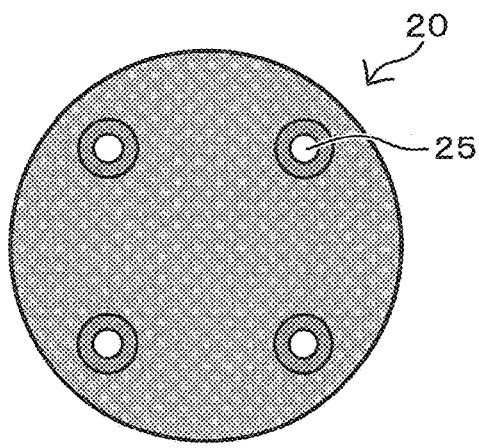
FIG. 6B is a schematic cross-sectional view showing an example of locating the nozzles of the discharge device.
Figure 6C:
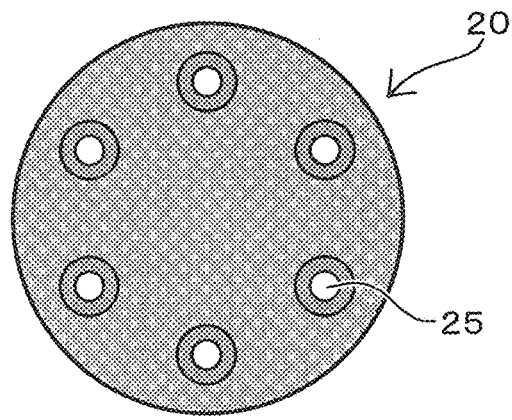
FIG. 6C is a schematic cross-sectional view showing an example of locating the nozzles of the discharge device.
Figure 6D:
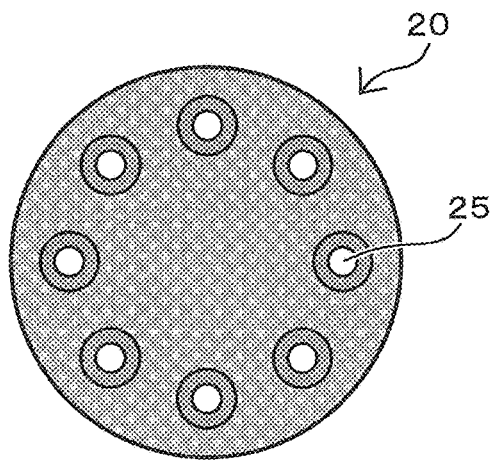
FIG. 6D is a schematic cross-sectional view showing an example of locating the nozzles of the discharge device.

In one preferable embodiment, the dangling thread portions are formed by interrupting the contiguous supply flow of the sealing material. For example, as shown in FIG. 4 and FIG. 5, the sealing material is supplied such that a supply flow 15' of the sealing material is contiguous between portions of the sealing material 12 that have been deposited (hereinafter may be referred to as "deposited sealing materials 12") on the substrate 40 and the sealing material in the discharge device 20, and the dangling thread portions 10 are formed by breaking the contiguous state 15 of the supply flow 15'. Thus, the dangling thread portions 10 are left by the immediately previous formation of the sealing member, which can facilitate formation of the dangling thread portions 10. FIG. 4 is a schematic cross-sectional view illustrating an example of forming preferable dangling thread portions. FIG. 5 is a schematic cross-sectional view more specifically illustrating an example of forming preferable dangling thread portions.

In order to break the contiguous state of the supply flow, the separation distance between the deposited sealing materials 12 and the discharge device may be widened. The discharge device 20 may be slowly moved upward so as to be more distal to the substrate 40 (as shown in FIG. 4 and FIG. 5), or the substrate 40 may be slowly driven downward so as to be more distal to the discharge device 20. In either case, when gradually widening the separation distance between the deposited sealing materials 12 and the discharge device 20 (in particular the nozzles 25 of the discharge device 20), the contiguous state 15 of the supply flow 15' through each nozzle gradually becomes thinner and thinner and is eventually broken, such that the dangling thread portion 10 is formed. In addition to or alternative to widening the separation distance between the deposited sealing materials 12 and the discharge device, the supply of the sealing material from the discharge device may be interrupted, which also can break the contiguous state of the supply flow of the sealing material. In particular, stopping the supply of the sealing material from the discharge device while widening the separation distance between the deposited sealing materials and the discharge device, can facilitate more efficient formation of the dangling thread portions.

In the method of manufacturing according to the present disclosure, due to the breaking of the contiguous state 15 of the supply flow of the sealing material, projections 55 are formed on the sealing member 50, as shown in FIG. 4 and FIG. 5. That is, accompanying to the formation of the dangling thread portions 10, the projections 55 can be provided on the sealing member (each of the sealing members) 50. More specifically, when the contiguous state of the supply flow is broken, "dangling thread portions due to the contiguous state of supply flow" are formed above the broken positions and "projections due to the contiguous state of supply flow" are formed below the broken positions. Such "projections" are formed on the respective surfaces of the sealing members due to the dangling thread portions left as designed, according to the present disclosure.

As shown in FIG. 4 and FIG. 5, the discharge device 20 used in the method of manufacturing according to the present disclosure has a plurality of nozzles 25. In the present disclosure, the dangling thread portion 10 is preferably left dangling from each of the plurality of nozzles 25 of the discharge device. That is, a thread of sealing material portion is preferably formed dangling downward from each of the plurality of nozzles. The discharge device 20 has at least three nozzles, preferably has three to ten nozzles 25, as shown in FIGS. 6A to 6D. For example, the sealing material may be supplied using the discharge device 20 having 6 to 8 nozzles (for example 8 nozzles), as shown in FIG. 6A to FIG. 6D.

Each of the dangling thread portions 10 dangling downward from each of the plurality of nozzles 25 may have a tapering shape as shown in FIG. 1. That is, for example, each of the dangling thread portions dangling downward from each of the plurality of nozzles may have a shape tapering downward such that the vertically-lowermost end is pointed. Further, as shown in FIG. 4 and FIG. 5, the sealing material is preferably supplied concurrently through the plurality of nozzles such that the supply flow 15' of the sealing material is contiguous between "the portions of the sealing material 12 that has been deposited on the substrate 40" and "a corresponding one of the plurality of nozzles 25 of the discharge device 20", and that a plurality of dangling thread portions 10 are formed by breaking each of the plurality of continuities 15 that have been concurrently formed.

Figure 8:
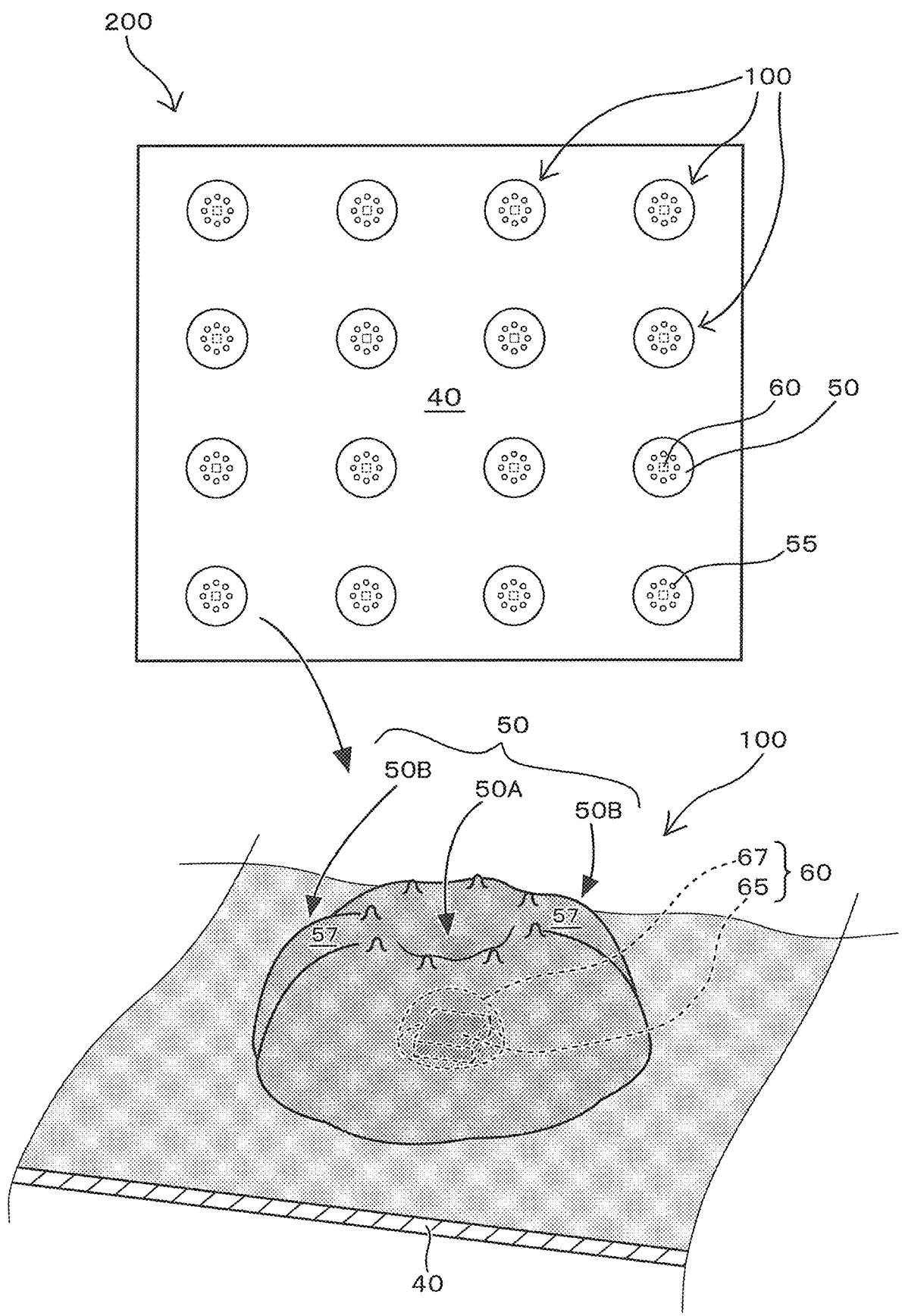
FIG. 8 is a schematic plan view showing a light emitting device according to one embodiment of the present disclosure and an enlarged schematic perspective view of one of the light-emitting parts of the light emitting device.
Figure 9:
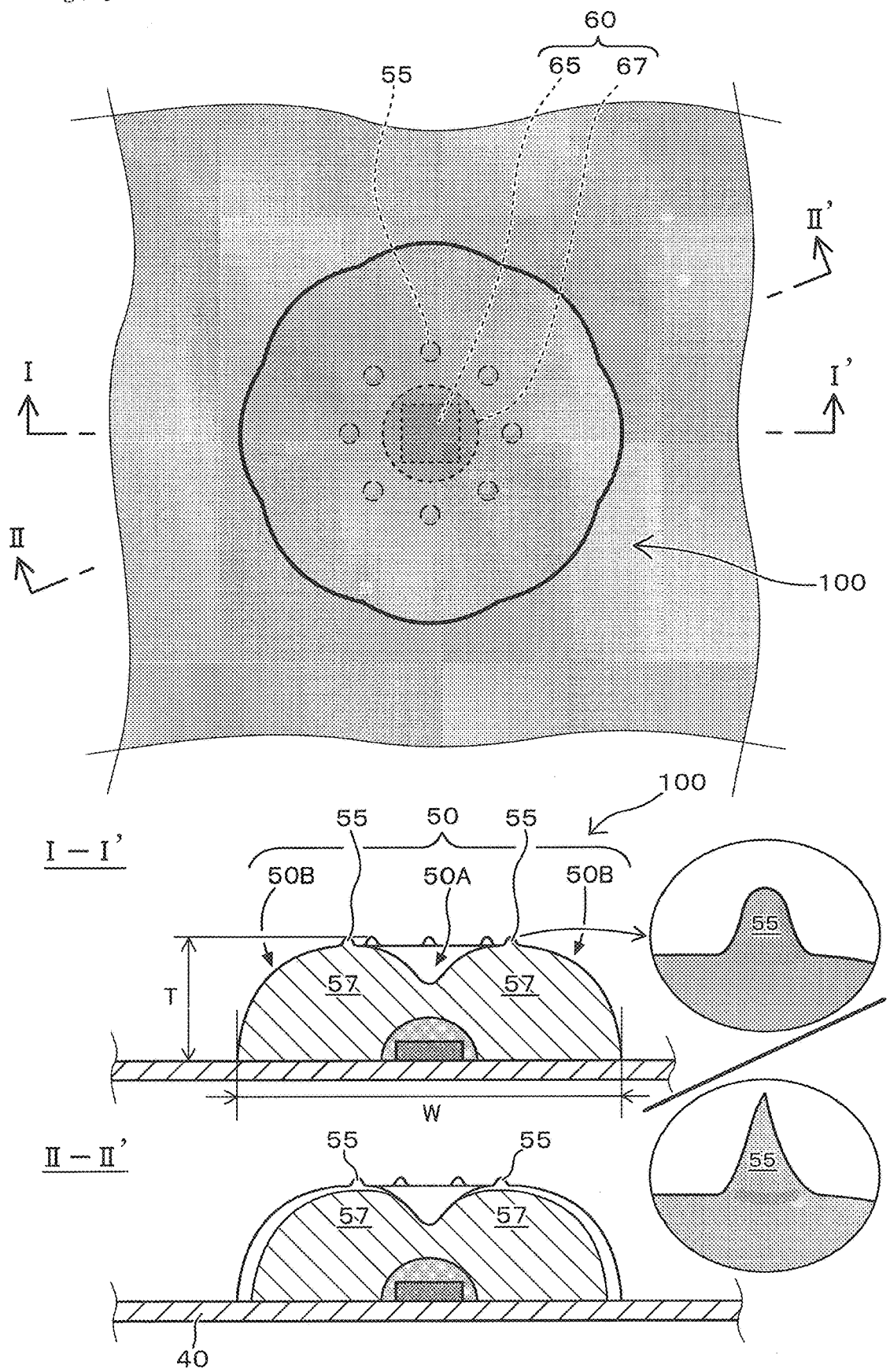
FIG. 9 is a schematic plan view and schematic cross-sectional views of one example of the light emitting device (in particular the light-emitting part) according to one embodiment of the present disclosure.

In the method of manufacturing according to certain embodiments of the present disclosure, a plurality of the dangling thread portions are formed and accordingly, a plurality of the projections corresponding to the plurality of dangling thread portions on each of the sealing members. As shown in FIG. 4 and FIG. 5, a plurality of portions of the supply flow in contiguous state 15 are broken to form the plurality of dangling thread portions 10, and consequently, a plurality of projections 55 are formed on the sealing member 50. The sealing material is supplied from each of the plurality of nozzles 25 of the discharge device 20, such that each of the sealing members 55 can have a shape formed with a plurality of mounds 57, and the projection 55 can be formed on each of the plurality of mounds 57. It is preferable that, as shown in FIG. 8 and FIG. 9, each of the sealing members 50 includes a plurality of mounds 57, and a single projection 55 is formed on each of the plurality of mounds 57.

The method of manufacturing according to the present disclosure can be embodied in various formed of embodiments.

Embodiment of Forming More Preferable Dangling Thread Portions

An embodiment of forming more preferable dangling thread portions will be described below. In the method of manufacturing according to the present disclosure, dangling thread portions are formed prior to start of each successive forming of the sealing members. The successive forming of the sealing members may be performed under conditions that allow obtaining the dangling thread portions.

The nozzles of the discharge device used in the method of manufacturing according to the present disclosure are preferably small-aperture nozzles. In other words, in order to form the dangling thread portions, a smaller diameter of the apertures of the nozzles of the discharge device is preferable in particular to form the dangling thread portions. For example, the aperture diameter of each of the nozzles of the discharge device is preferably in a range of 0.1 mm to 0.9 mm, more preferably in a range of 0.2 mm to 0.7 mm, further preferably in a range of 0.2 mm to 0.5 mm. For example, the nozzles of the discharge device may have an external diameter in a range of 0.6 mm to 0.7 mm, and an internal diameter in a range of 0.3 mm to 0.4 mm.

In order to form hanging threads, in addition to or alternatively to narrower nozzles, the use of the sealing material with higher viscosity is preferable. That is, the sealing material discharged from the nozzles is preferably a high-viscosity fluid. For example, the sealing material preferably has a viscosity such that when the contiguous state 15 of the supply flow is broken, the portion of sealing member left attached to each of the nozzles is in a state of long thread trailing from each of the nozzles. More specifically, the sealing material has a viscosity preferably in a range of 180 Pa·s or greater and 260 Pa·s or less, more preferably 200 Pa·s or greater and 240 Pa·s or less, further preferably in a range of 210 Pa·s or greater and 230 Pa·s or less. In the present specification, the term "viscosity" refers to values of viscosity of the sealing material to be supplied to the discharge device, measured by using a rotational viscometer. More specifically, each value is an average (arithmetic mean) of six values each obtained by measuring using VISCOMETER•TVE-35H (manufactured by Toki Sangyo Co., Ltd) under a temperature condition at room temperature (20° C.). The viscosity can be adjusted by the content of the filler material in the resin, for example, a mixture of the resin and the filler material in a ratio of 10:1 can be used as the sealing material.

Test Deposition

In one embodiment, in order to form the dangling thread portions, the sealing material is supplied to carry out a test deposition. That is, prior to form the sealing members of the light-emitting parts, a portion of the sealing material that is not used to form the sealing member is test deposited to form dangling thread portions dangling from the discharge device. Then, forming of the sealing member of the light-emitting part (first forming of the sealing member) is started using the dangling thread portions.

Figure 7:
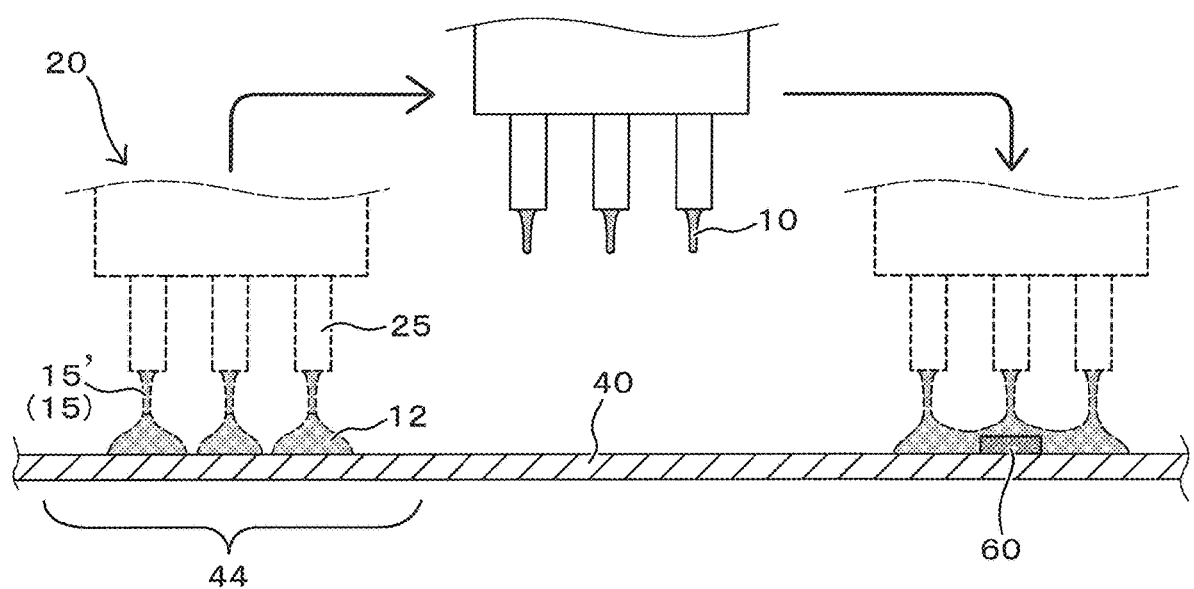
FIG. 7 is a schematic cross-sectional view illustrating "test supply".

For example, as shown in FIG. 7, the dangling thread portions 10 may be formed through supplying the sealing material from the discharge device 20 on a non-light emitting region 44 of the substrate 40 where the light emitting elements are not disposed. More specifically, the dangling thread portions 10 may be formed by supplying the sealing material such that the supply flow 15' of the sealing material is contiguous between the portions of the sealing material 12 that has been deposited on the non-light emitting region 44 of the substrate 40 and the discharge device 20 (more specifically, respective ones of the nozzles 25 of the discharge device 20), and then breaking the contiguous state 15 of the supply flow, thus leaving portions of the sealing material dangling from the discharge device 20 (i.e., from ends of respective ends of the nozzles 25).

According to the present embodiment, the sealing member of the light-emitting part that is the first of the plurality of light-emitting parts to be formed on the substrate can be formed efficiently. That is, with the test deposition as described above, the supply of the sealing material for the first formation of the sealing member can be started more smoothly and more precisely.

In certain embodiments, the sealing material is preferably supplied successively in forming the sealing members of certain light-emitting parts and in successive forming of sealing members of other light-emitting parts, but test deposition may be performed when the supply of the sealing material is halted between forming the sealing members of certain light-emitting parts and the successive forming of sealing members of other light-emitting parts for a longer period of time, that is, for example, when a longer period time is given before re-starting supply of the sealing material. More specifically, at an appropriate time between forming the sealing members for certain light-emitting parts and forming the sealing members for other light-emitting parts, the sealing material may be deposited on a non-light emitting region of the substrate to form the dangling thread portions. In this case also the dangling thread portions can be suitably used in successive forming of the sealing member.

Arranging Nozzles in a Circle

In certain embodiments, a plurality of nozzles 25 of the discharge device 25 are arranged in a circle. For example, as shown in FIG. 6, the discharge device 20 may include a plurality of nozzles 25 arranged in a circle, in a plan view viewed from a discharge side of the discharge device 20. The plurality of nozzles 25 are preferably aligned in a circle. Examples thereof include, three nozzles 25 (FIG. 6A), four nozzles 25 (FIG. 6B), six nozzles 25 (FIG. 6C), and eight nozzles 25 (FIG. 6D), respectively aligned in a circle as illustrated in the figures. As shown in FIG. 6A to FIG. 6D, the plurality of nozzles 25 aligned in a circle are preferably point-symmetrical in a plan view of the discharge device 20. In particular, in the discharge device 20 having a greater number of nozzles 25 such as "six nozzles" and "eight nozzles," the nozzles are preferably aligned so as to be spaced apart from each other on a common circle.

The sealing material can be supplied through each of the plurality of nozzles aligned in a circle, and also dangling thread portions can be formed dangling downward from each of the plurality of nozzles. Accordingly, the plurality of mounds forming each of the sealing members are aligned in a circle, and portions of adjacent mounds are preferably merged with each another. In other words, as shown in FIG. 8 and FIG. 9, the sealing members 50 formed by using such a plurality of nozzles can have a shape having a plurality of mounds 57 encircling a dent at a center portion. Each of the plurality of mounds 57 preferably has a projection 55 described above.

(Singulating)

In one embodiment, light emitting devices each having a single light-emitting part are obtained by singulating. More specifically, the substrate provided with the plurality of light-emitting parts each having a light source and a sealing member and obtained by the method of manufacturing described above is singulated to a plurality of light emitting devices each having a single light-emitting parts. The singulating can be performed through a mechanical process such as dicing, a physical process such as laser cutting, or the like.

The singulating may be performed such that the substrate is divided such that the sealing members formed by the first forming the sealing members formed by the second forming are separated from each other. That is, the substrate may be divided such that the light-emitting part(s) each having the sealing member formed by the first forming and the light-emitting part(s) each having the sealing member formed by the second forming may be separated from each other.

The present embodiment corresponds to a method of manufacturing a light emitting device having a single light-emitting part, which also corresponds to a method of manufacturing that includes the singulation performed on the substrate having a plurality of sealing members each sealing a corresponding one of the plurality of light sources.

Light Emitting Device

The light emitting device according to certain embodiments of the present disclosure is obtained according to the method as described above, in which the sealing members are formed through the use of the "hanging threads". Further, the light emitting device includes one or more light-emitting parts disposed on a substrate, each of the one or more light-emitting parts having a sealing member covering a light source, and each sealing member having a plurality of projections on a peripheral portion surrounding a dent.

In the light emitting device according to certain embodiments of the present disclosure, at least one light-emitting part 100 is disposed on the substrate 40. As described above, the light emitting device according to certain embodiments of the present disclosure may include either a single light emitting part 100 or a plurality of the light emitting parts 100.

As shown in FIG. 8, the light emitting device 200 according to some preferable embodiments, a plurality of light-emitting parts 100 are disposed on the substrate 40. That is, a plurality of light sources 60 are disposed on the substrate 40 and a plurality of the sealing members 50 each covering a corresponding one of the light sources 60 are disposed on the substrate 40. Each of the sealing member 50 is formed with a dent 50A, which is preferably located above the light source 60, as shown in FIG. 8 and FIG. 9. In other words, the dent 50A is located at approximately the center of the sealing member 50 in a plan view. In the light emitting device according to certain embodiments, the sealing member 50 of each of the light-emitting parts has a plurality of projections 55 on a peripheral portion 50B surrounding the dent 50A.

The light-emitting part having the sealing member as described above can exhibit a batwing light distribution. Accordingly, a light emitting device with little unevenness in light, in particular, with little luminance unevenness, can be realized, even when the light emitting device has a small thickness (for example, even when a light-diffusing plate that is to be described later below is provided at a smaller separation distance from the light-emitting parts).

As shown in FIG. 8 and FIG. 9, the sealing member 50 according to certain embodiment has a flat overall shape. In particular, as shown in a cross-sectional view in FIG. 9, although the outline of the sealing member that is located above the upper surface of the substrate includes a rounded portion or a curved portion, a relatively small overall thickness has been realized. The shape of each of the light-emitting parts is determined by the shape of its corresponding sealing member, and therefore, the flat overall shape of the sealing member indicates that each of the light-emitting part has a flat overall shape. More specifically, each of the sealing member at least has a thickness dimension (in particular, a maximum thickness dimension T) smaller than a width dimension (in particular, a maximum width dimension W), as shown in FIG. 9. For example, the sealing members have shapes that satisfy a relationship 2T≤W. With the sealing members each having such a flat shape, the light-emitting parts with lower heights can be obtained. Accordingly, in the light emitting device according to certain embodiments of the present disclosure, breaking of the light-emitting part(s), detaching of the light-emitting part(s) from the substrate, or the like caused by unintentional external force barely occur.

Figure 10:
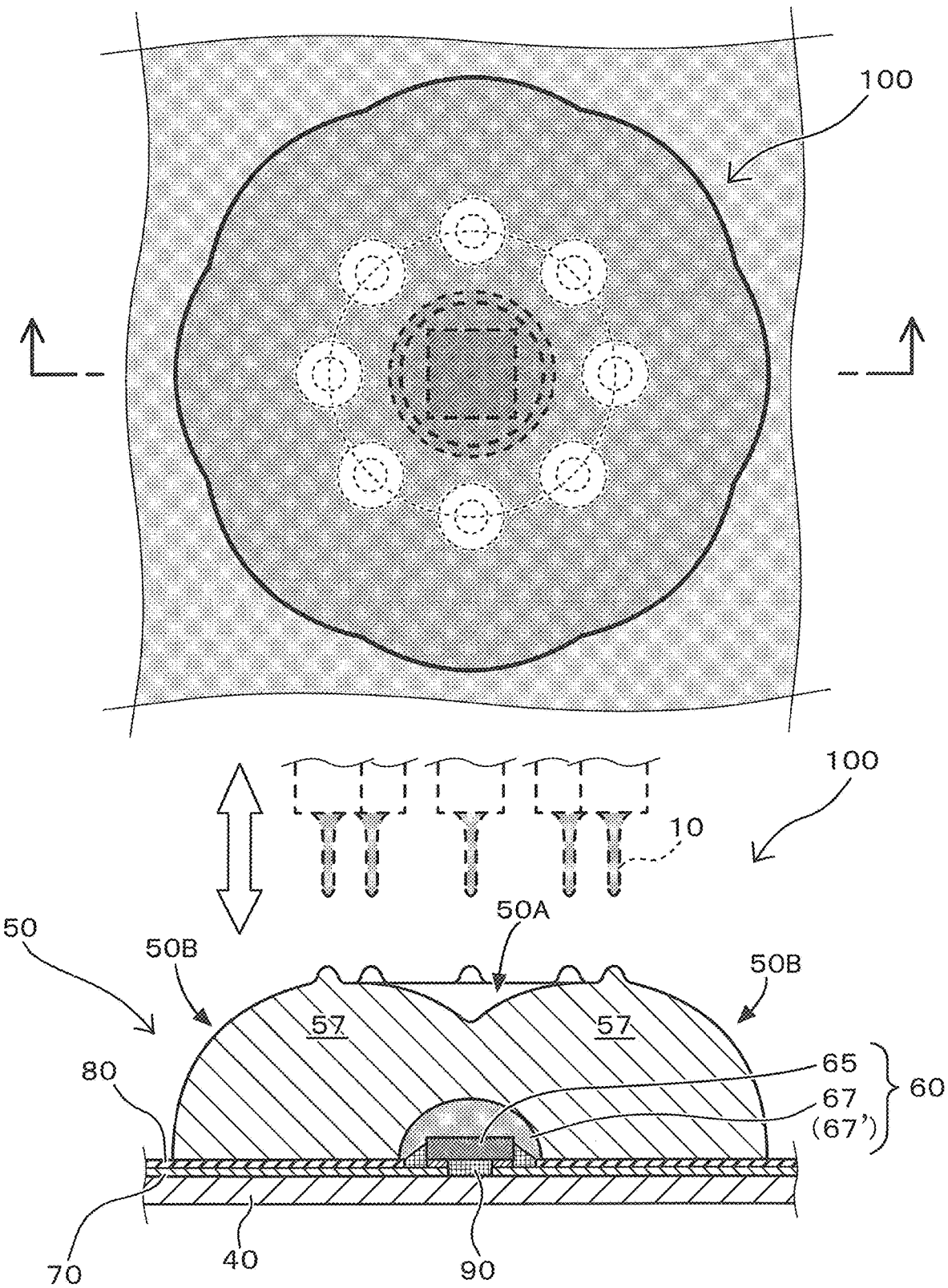
FIG. 10 is a schematic plan view and schematic cross-sectional views of more specific example of the light emitting device (in particular the light-emitting part) according to the one embodiment of the present disclosure.
Figure 12:
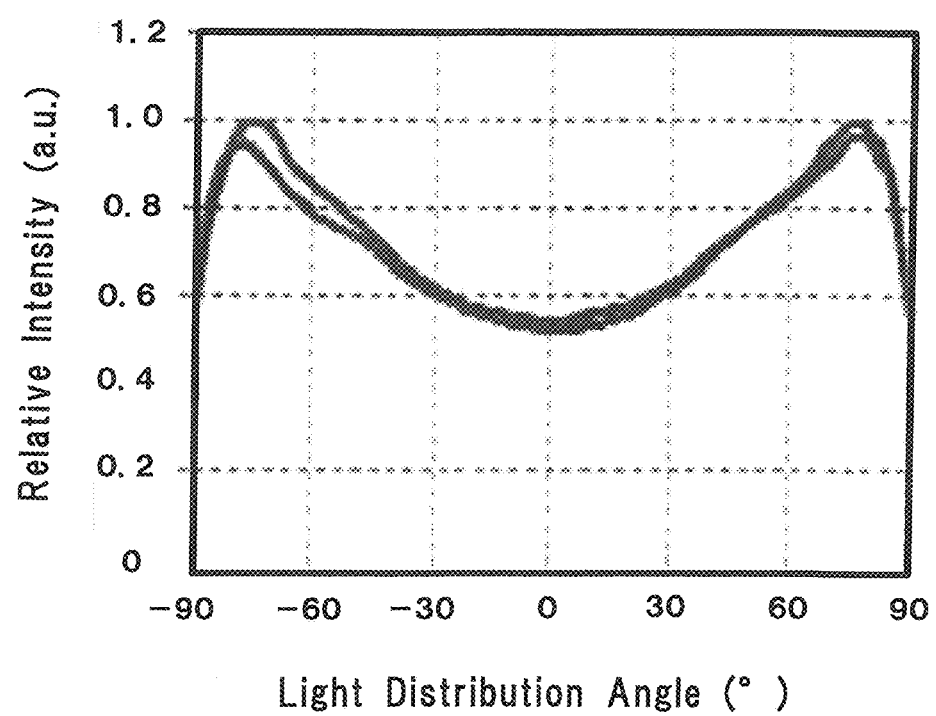
FIG. 12 is a diagram illustrating light distribution characteristics of the light-emitting part provided to the light emitting device according to one embodiment of the present disclosure.
Figure 13:
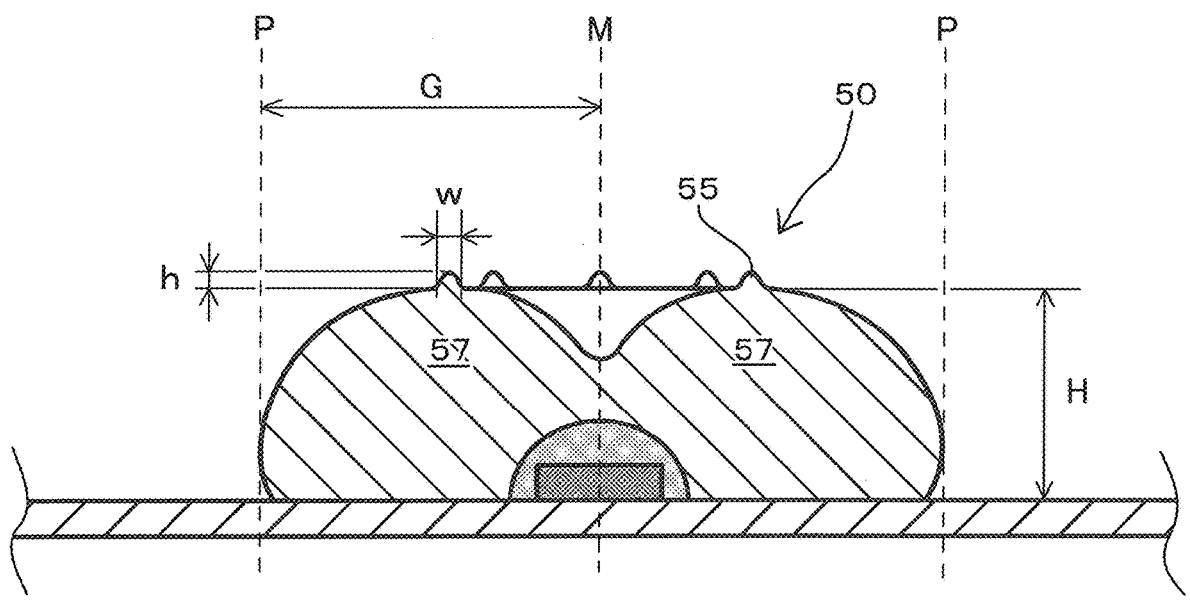
FIG. 13 is a schematic cross-sectional view illustrating locational configuration and dimensions of the projection of one of the sealing members.

In some preferable embodiments, the projections are formed at upper portions of the peripheral portion of each of the sealing members. That is, as shown in FIG. 9 and FIG. 10, in the sealing member 50 of the light-emitting part 100, the projections 55 are formed at an upper portion of the peripheral portion 50B surrounding the dent 50A. The projections 55 are formed, due to the formation of the dangling thread portions 10 when forming the sealing members, as shown in FIG. 10. The term "upper portion" as used above refers to an upper half region in the thickness (height) of the sealing member in a cross section of each of the light-emitting part. More specifically, as shown in FIG. 12, when a height of a projection that is to be described below is indicated as "H", each projection is formed in a region of a single sealing member between approximately an uppermost portion of a mound (a height of the projection is not included; the same will be applied hereinafter) and one third of H downward from the uppermost portion, preferably a region of a single sealing member between approximately an uppermost portion of a mound and one fourth of H downward from the uppermost portion, more preferably a region of a single sealing member between approximately a uppermost portion of a mound and one fifth of H downward from the uppermost portion. FIG. 9 is a schematic view illustrating an example of structure of the light emitting device according to one embodiment of the present disclosure, and FIG. 10 is a schematic view illustrating a more specific example of structure of the light emitting device according the one embodiment of the present disclosure.

In the light emitting device according to certain embodiments, "projections" are each attributed to a corresponding one of the dangling thread portions and therefore have specific shapes. More specifically, each of the projections 55 preferably projecting vertically upward. Also, each of the projections 55 preferably has a shape tapering to an end. In some preferable embodiments, as shown in FIG. 9, each of the projections 55 has a pointed tip. That is, each of the projections 55 formed in the peripheral portion of each of the sealing members preferably has a pointed tip. As illustrated in the figure, such a projection 55 can also be referred to have an upwardly projecting angular point. Also, the plurality of the projections 55 are respectively attributed to a corresponding one of the dangling thread portions, and are formed aligned in a common circle, adjacent and spaced apart from one another.

Each of the sealing members 50 has a peripheral portion 50B formed with a plurality of mounds 57 encircling a dent 50A. Each of the plurality of mounds 57 is caused by the supply of the material through each of the plurality of nozzles of the discharge device. Accordingly, the number of mounds 57 corresponds to the number of the nozzles. More specifically, each of the sealing members 50 can be provided with three to ten of the mounds 57 at the peripheral portion 50B. For example, when the sealing material is supplied by using a discharge device having six to eight nozzles (for example, eight nozzles), corresponding to the number of the nozzles, the peripheral portion 50B of the sealing member 50 can have six to eight mounds 57 (for example eight mounds 57). As shown in FIG. 8 to FIG. 10, each of the peripheral portions 50B has an overall dome shape, while preferably retaining shapes of the plurality of mounds 57 with portions of adjacent mounds being merged with each other. That is, in some preferable embodiments, each of the peripheral portions 50B has a shape with rounded protrusions arranged in a bead-on-string fashion with portions of adjacent rounded protrusions being merged with each other. In particular, it is preferable that in each of the sealing members 50, the plurality of mounds 57 with portions of adjacent mounds being merged with each other are annularly arranged, and a dent 50A is formed at the center of the mounds 57. As illustrated in the cross-sectional views in the figures, the dent can be formed with a gradually increasing depth toward the center (in other words, the thickness of the sealing member is gradually decreased inward in the dent 50A).

In the light emitting device according to certain embodiments, a projection 55 is formed on each of the plurality of mounds 57. That is, as illustrated in FIG. 8 to FIG. 10, in the sealing member 50 of each of the light-emitting parts 100, the projections 55 are formed on the peripheral portion 50B surrounding the dent 50A, at locations corresponding to the plurality of mounds, respectively. It is preferable that, in the peripheral portion 50B, the projection 55 (preferably having a pointed tip) is formed on each of the plurality of mounds 57 in which portions of adjacent mounds have been merged with each other at the peripheral portion 50B. Such a configuration described above is obtained due to that each of the sealing member is formed by supplying the material through a plurality of nozzles of the discharge device, and particularly, that a dangling thread portion is formed at each of the plurality of nozzles. As described above, the projections are formed, attributed to the corresponding dangling-thread portions, which allows for positioning of each of the projections at, preferably, the uppermost portion of a corresponding one of the plurality of mounds 57. That is, as shown in FIG. 10, each of the projections 55 is preferably formed at the highest location of a corresponding one of the plurality of mounds 57. In the configurations illustrated in the figures (particularly in FIG. 9), the projection 55 of a very small size is positioned at the uppermost portion of each of the mounds 57, which preferably has a pointed end.

Each constituent component and member of the light emitting device according to the embodiments will be described in detail below.

The substrate 40 used for the light emitting device of certain embodiments is configured to mount a light-emitting part 100 having a light source 60, preferably an electrically insulating substrate for mounting a plurality of light-emitting parts 100, as shown in FIG. 8. The material of the substrate may contain a resin material and/or ceramics material. More specific examples of the resin materials of the substrate include at least one selected from the group consisting of a phenol resin, an epoxy resin, a polyimide resin, a BT resin, a polyphthalamide (PPA), and a polyethylene terephthalate (PET). The substrate made of such a resin material is preferable in terms of electrically insulating properties but also in terms of low costs, moldability, or the like. The substrate made of a resin material may contain glass fibers mixed in the resin material and/or an inorganic filler material such as $SiO_2$, $TiO_2$ and/or $Al_2O_3$ mixed in the resin material. With such a material. It is possible to obtain an improvement in the mechanical strength, a reduction in the thermal expansion coefficient and/or an improvement is the optical reflectance of the substrate. More specific examples of the ceramics material of the substrate include at least one selected from the group consisting of alumina, mullite, forsterite, glass-ceramics, nitride-based (for example, AN) ceramics, and carbon-based (for example, SiC) ceramics. The substrate made of such a ceramics material is preferable particularly in terms of facilitating the obtaining of light emitting devices with good heat-resisting properties and good light-resisting properties. For example, the substrate made of a ceramics material may be a ceramics made of alumina or a substrate made of alumina or made of a ceramic mainly made of alumina.

The substrate 40 used in the light emitting device according to certain embodiments of the present disclosure preferably include a light source 60 and electrically conductive wirings configured to supply power to the light source 60 as shown in FIG. 10. The electrically conductive wirings 70 are electrically connected to the light source 60 (for example, to the electrodes of the light emitting element) to supply electric current (power) from the outside. In other words, the electrically conductive wirings 70 can also be regarded as the positive and negative electrodes or parts thereof, such that electric current can be supplied from the outside, and may be disposed spaced apart from each other. The electrically conductive wirings may be provided at least on an upper surface of the substrate configured to serve as a mounting surface of the light emitting element. The material of the electrically conductive wirings can be appropriately selected according to the material of the substrate, the method of manufacturing, and so forth. For example, when the substrate is made of ceramics material, the material of the electrically conductive wirings preferably has a high melting point durable at a calcination temperature of ceramics sheet. For example, the material of the electrically conductive wirings may contain one or more high-melting point metals such as tungsten, molybdenum, or the like. The substrate may further be coated by other metal material such as nickel, gold and/or silver, or the like, by way of plating, sputtering, or vapor deposition. Moreover, when the substrate is made of a resin material, the electrically conductive wirings are preferably made of a material that can easily processed. For example, when the substrate is an injection-molded resin product, it is preferable to select the material of the electrically conductive wirings that is easily processed through punching, etching, bending or the like, and has relatively high mechanical strength. Examples of the materials of the electrically conductive wirings include metals such as copper, aluminum, gold, silver, tungsten rhodium, iron, nickel, and molybdenum, and iron-nickel alloy, phosphor bronze, iron copper.

The light source 60 used for the light emitting device according to certain embodiments of the present disclosure may be, for example, a light emitting element 65, as illustrated in the method of manufacturing described above, or a combination of a light emitting element 65 and a wavelength converting member 67, as illustrated in FIG. 10. In some preferable embodiments, the light source 60 is at least one light emitting element.

The composition, color of (emitting) light, shape, and/or dimensions of the light emitting element can be appropriately selected. The light emitting element 65 may be a light emitting diode (LED). A light emitting element of an appropriate wavelength can be selected according to the application. For a light emitting element configured to emit blue light, for example, so-called GaN-based light emitting element, InGaN-based light emitting element can be employed. For a light emitting element configured to emit blue light or green light, for example, ZnSe or a nitride-based semiconductor ($In_xAl_yGa_{1-x-y}N$, $0 \leq X$, $0 \leq Y$, $X+Y \leq 1$) and/or GaP can be used. For a light emitting element configured to emit red light, for example, GaAlAs and/or AlInGaP can be used. These materials are only examples, and other appropriate semiconductor light emitting elements can also be used.

In some preferable embodiments, as shown in FIG. 10, the light source 60 includes a wavelength converting member 67 covering the light emitting element 65. The wavelength converting member 67 is configured to convert a portion or the entire of the light emitted from the light emitting element 65 into light of a different wavelength, and for example, a fluorescent member may be used. In such case, the fluorescent member in the shape of a fluorescent resin (a fluorescent material-containing resin) may be employed. As described above, the light emitting device according to certain embodiment of the present disclosure may have a configuration such that the light emitting element 65 is covered by the fluorescent material-containing resin 67', and the light source 60 including the light emitting element 65 and the fluorescent material-containing resin 67' is covered by the sealing member 50. For example, the light source 60 may include a light emitting element 65 to emit blue light and a wavelength converting member 67' that can emit yellow light upon being excited by the blue light such that white light that is a mixture of the blue light and the yellow light can be emitted from the light emitting part.

When the wavelength converting member is included in the light source, the light emitting element is preferably a semiconductor light emitting element configured to emit short-wavelength light that can efficiently excite the wavelength converting member. For example, a semiconductor light emitting element including a nitride-semiconductor ($In_x$ $Al_y$$Ga_{1-x-y}$N, $0 \le X$, $0 \le Y$, $X+Y \le 1$) can be used. The wavelength of light to be emitted from such light emitting element can be predetermined by the materials of the semiconductor layer and the ratio of the mixed crystals. The light emitting element may have the positive and negative electrodes either on the same surface side or on different surfaces.

In the light emitting device according to certain embodiments of the present disclosure, the light emitting element 65 may include, for example, a growth substrate and a semiconductor multi-layer on the growth substrate. The semiconductor multi-layer includes an n-type semiconductor layer, an active layer, and a p-type semiconductor layer in this order on the growth substrate, and an n-type electrode is disposed on the n-type semiconductor layer, and a p-type electrode is disposed on the p-type semiconductor layer. For the growth substrate, a light-transmissive sapphire substrate or the like may be employed. The light emitting element 65 may be flip-chip mounted, in which through a bonding material, the electrodes of the light emitting element are electrically connected to the electrically conductive wirings on the surface of the substrate, such that a surface opposite to the surface provided with the electrodes, that is, a main surface of the light-transmissive sapphire substrate, serves as the light-extracting surface. The light emitting element may be arranged across the positive and negative electrically conductive wirings, which are separated so as to be insulated from each other, and are connected respectively to a corresponding one of the positive and negative electrically conductive wirings through an electrically conductive bonding material. Examples of the method of mounting such light emitting element include a mounting method employing a solder paste and a method employing bumps.

Figure 11A:
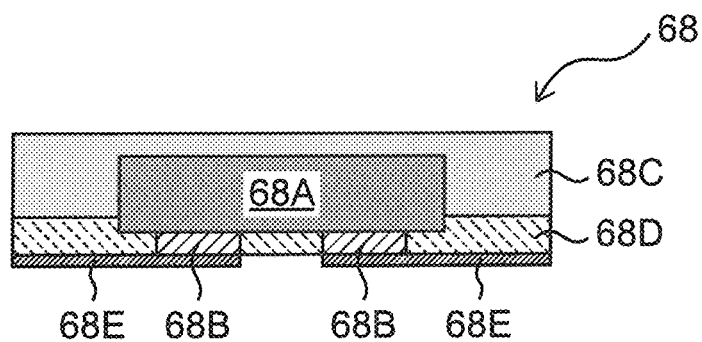
FIG. 11A is a schematic cross-sectional view illustrating a structure in which a light emitting element is included in a package.
Figure 11B:
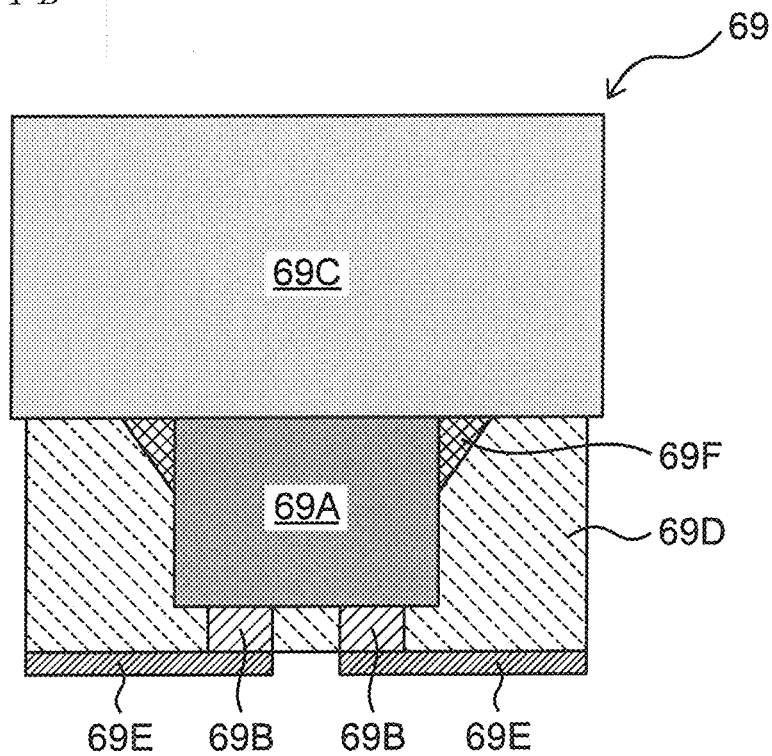
FIG. 11B is a schematic cross-sectional view illustrating a structure in which a light emitting element is included in a package.

The light emitting element used in the light emitting device according to certain embodiments of the present disclosure may be included in a light emitting element package, such as, for example, the light emitting element package 68 shown in FIG. 11A, the light emitting element package 69 shown in FIG. 11B, or the like. The light emitting package 68 shown in FIG. 11A is a so-called chip size package and includes electrodes 68B on the same surface-side, and a wavelength converting member 68C containing a fluorescent material. The light emitting package 69 shown in FIG. 11B is a so-called chip size package and includes electrodes 69B on the same surface-side, and a wavelength converting member 69C containing a fluorescent material. In the light emitting element package 68 shown in FIG. 11A, the surface opposite from the surface provided with the electrodes and portions of lateral surfaces of the light emitting element 68A are covered by a wavelength converting member 68C. Further, the light emitting element package 68 includes a resin member 68D containing light-reflecting particles such as filler particles under and in contact with the wavelength converting member 68C, and electrodes 68E of the light emitting element package 68 electrically connected to the electrodes 68B further under the wavelength converting member 68C. Meanwhile, in the light emitting element package 69 shown in FIG. 11B, the surface opposite from the surface provided with the electrodes of the light emitting element 66A are covered by a wavelength converting member 68C. Further, a light-transmissive fillet 69F is provided such that light emitted from the lateral surface(s) of the light emitting element is incident on the wavelength converting member 68C, and a resin member 69D containing light-reflecting particles such as filler particles under and in contact with the wavelength converting member 69C and the fillet 69F, and electrodes 69E of the light emitting element package 69 electrically connected to the electrodes 69B further under the wavelength converting member 69C. Light is extracted mainly from an upper surface and portions of the lateral surfaces of each of the light emitting element packages 68 and 69 shown in FIG. 11A and FIG. 11B.

As seen in FIG. 10, the sealing member 50 provided to the light emitting device as described above can at least protect the light source 60 from external environment. The sealing member 50 is also configured to contribute to optical control of light emitted from the light emitting element, for example, contribute to achieve a batwing light distribution. Examples of the materials of the sealing member include silicone resin, epoxy resin, phenol resin, polycarbonate resin, acrylic resin, TPX resin, polynorbornene resin, modified resin thereof and hybrid resin thereof. In some preferable embodiments, the material of the sealing member includes one or more light-transmissive resins, examples thereof include epoxy resin and silicone resin. Among those, a silicone resin that has higher thermal stability and light stability is further preferable. The sealing member may include a wavelength converting material, for example, a material (such as a fluorescent material) that can absorb light from the light emitting element and emit light of a wavelength different from the light emitted from the light emitting element. The sealing member may include a light diffusing material that can diffuse light form the light emitting element. The sealing member may include a coloring agent such as an appropriate pigment or the like.

As shown in FIG. 10, in the light emitting device according to certain embodiments of the present disclosure, the substrate 40 may be provided with an electrically insulating layer 80. The electrically insulating layer 80 is disposed on the electrically conductive wirings 70 but not to cover the portions for electrical connection for the light source(s) and other component(s). For example, as shown in FIG. 10, the electrically insulating layer 80 may be disposed on the substrate 40 as a resist to cover the electrically conductive wirings 70 in an insulating manner. As described above, the electrically insulating layer 80 is provided to electrically insulate the electrically conductive wires 70, but also a white filler material, which is similar to that contained in the underfill to be described below, may be contained in the electrically insulating layer 80 to reduce or prevent leakage and/or absorption of light to improve the light extraction efficiency of the light emitting device. For the electrically insulating layer 80, an appropriate electrically insulating material, preferably with little absorption of light from the light emitting element can be employed. Examples of the material of the electrically insulating layer 80 include epoxy resin, silicone resin, modified silicone resin, urethane resin, oxetane resin, acrylic resin, polycarbonate resin, polyimide resin, and at least one of those may be employed.

In the light emitting device according to certain embodiment of the present disclosure, when the light emitting element is mounted, an underfill 90 may be provided between the light emitting element 65 and the substrate 40, as shown in FIG. 10. For the underfill 90, a material with little absorption of light from the light emitting element can be appropriately selected. Examples of the materials of the underfill 90 include epoxy resins, silicone resins, modified silicone resins, urethane resins, oxetane resins, acrylic resins, poly carbonate resins and polyimide resins, and at least one of those may be employed. The underfill 90 may contain a filler material to efficiently reflect light from the light emitting element, and also to achieve the thermal expansion coefficient of the underfill 90 much closer to that of the light emitting element. The filler material may be a white filler material, which can facilitate reflection of the light and therefore can improve the light extraction efficiency. In the specification, the term "white" also refers to a case in which the filler itself is transparent but appears white because of scattering under a condition of a difference in the refractive index with that of the material around the filler. The filler material may contain an inorganic compound.

As shown in FIG. 8, the light emitting device 200 according to certain embodiments preferably include a plurality of light emitting parts 100. Such light emitting devices 200 can be more suitably used In the light emitting devices according to the present disclosure, each of the plurality of light-emitting parts preferably produce a batwing light distribution. That is, each of the light emitting parts exhibits a batwing light distribution curve due to the shape of the sealing member, with which a wide range light distribution becomes possible. According to certain embodiments of the present disclosure, a desired batwing light distribution can be achieved even the sealing member has the projections at each of the light emitting parts, as shown in FIG. 11. If the projections are removed from the sealing member by, for example, grinding the projections, upon assuming that the projection adversely affect the light distributing properties of the light-emitting part, it may worsen the light distributing properties due to the parts of the sealing member where the projections are removed. However, according to certain embodiments of the present disclosure, the projections on the sealing member can be left in situ without significantly affecting the desired batwing light distribution characteristics. It is thought to be due to the presence of the projection at a preferable position and/or to the projection having a suitable small size. The preferable position of the projections can be, in a cross-sectional view of the sealing member 50 as shown in FIG. 12, located so as not too distal to the optical axis M (i.e., a line normal to a center of a main surface of the light emitting element) in a width direction of each the projections. More specifically, when assuming a separation distance "G" between the optical axis M and the outermost end P of the sealing member, the projection 55 is formed within a range 2G/3 from the optical axis in the width direction (for example, the projection 55 is formed at a position about G/2 from the optical axis M in the width direction). Meanwhile, the suitable small size of the projection 55 is such that, as shown in FIG. 12, the projection 55 is significantly smaller than the mound 57. For example, in the cross-sectional view of the sealing member 50, when the height of the projection 55 is assumed "h" and the height of the mound 57 is assumed "H", the dimensions of the projection 57 preferably satisfy $0<h\leq H/8$, more preferably satisfy $0<h\leq H/10$, further preferably satisfy $0<h\leq H/12$. Similarly, when a maximum width of the projection 55 is assumed "w" and the separation distance between the optical axis M and the outermost periphery of the sealing member in the width direction is assumed "G", the maximum width "w" of the projection 57 preferably satisfy $0<w\leq G/7$, more preferably satisfy $0<w\leq G/10$, further preferably satisfy $0<w\leq G/12$.

According to certain embodiments of the present disclosure, even if the presence of the projection 55 exhibits an effect on the batwing light distribution characteristics, generally the effect is not minute and does not pose substantial concern for the light emitting device having a plurality of the light emitting parts. That is, in the light emitting devices using a plurality of light emitting parts such as general lighting devices, backlights, etc., the plurality of light emitting parts are arranged such that light emitted form a single light emitting part is combined or mixed with light emitted from its adjacent light emitting part(s). The influence of light emitted from the adjacent light emitting part(s) exceeds far greater than an effect due to the presence of the projection, and thus the influence exerted from the presence of the projection can be negligible.

In some preferable embodiments, the projections of the sealing member can be utilized to adjust the light distributing properties. The projections may be utilized when the projections can affect preferably to the light distributing properties. For example, when the light emitted from the light source exhibits directional dependency, such as that light emitted from the light emitting element exhibits a distribution of light that varies in direction, it is possible to utilize the projections of the sealing member to correct, even a little, the directional dependence in the light distribution.

The light emitting device according to certain embodiments of the present disclosure can be variously provided with other members according to usage. For example, the light emitting device according to certain embodiments of the present disclosure may be provided with a light-diffusion plate above the substrate having the plurality of light emitting parts. The light emitted from the light emitting parts can be diffused, which can facilitate obtaining desired light. In addition to the light-diffusion plate, in order to obtain light of a desired color, a fluorescent material plate, a fluorescent material sheet, or the like may also be provided before the light-diffusion plate (that is, a location closer to the light emitting parts).

The embodiments described above are meant to be exemplary and are not intended to limit the scope of the disclosure. From the description provided above, various alternate embodiments will become apparent to one skilled in the art.

For example, in one embodiment of the method of manufacturing described above, the discharge device is temporarily lowered while the dangling thread portions are left dangling from respective nozzles of the discharge device, but at this time, the discharge device may be moved more greatly downward. For example, the discharge device may be moved downward such that the tips of the dangling thread portions come in contact with the substrate or slightly above the substrate. In such cases, the dangling thread portions can be used as guide and thus more precise start of supplying the sealing member can be achieved.

In the above description, singulating to obtain light emitting devices each having a single light emitting part has been illustrated, but singulating may be carried out to obtain light emitting devices with any predetermined number of light-emitting parts. That is, light emitting devices having a predetermined number of the light-emitting parts can be obtained by dividing the substrate provided with a plurality of the sealing members, each covering a corresponding one of the plurality of the light sources, obtained according to the method described above.

The light emitting device according to the present disclosure can be used for various fields of applications, such as general lighting, backlights, indicators, light sources for automobile use, displays, sensors, signals, and channel control characters for signboards.

Obviously, numerous modifications and variations of the present disclosure are possible in light of the above teachings. It is therefore to be understood that, within the scope of the appended claims, the disclosure may be practiced other than as specifically described herein.

What is claimed is:

1. A method of manufacturing a light emitting device, the method comprising:
    providing a substrate and a plurality of light sources disposed on the substrate; and
    forming a plurality of sealing members, each covering a respective one of the plurality of light sources, by supplying a sealing material onto the substrate through a plurality of nozzles of a discharge device;
    wherein the step of forming the plurality of sealing members comprises:
        performing a first forming step, in which one or more of the sealing members is formed such that a portion of the sealing material is retained dangling from a respective at least one of the plurality of nozzles as at least one dangling thread portion, and such that each of said one or more of the sealing members includes a dent, a peripheral portion surrounding the dent, and at least one projection at the peripheral portion, and
        successively performing a second forming step, which is started while the at least one dangling thread portion of the sealing material is retained dangling from the at least one of the plurality of nozzles of the discharge device.

2. The method of manufacturing a light emitting device according to claim 1, wherein the sealing material is supplied such that a supply flow of the sealing material is contiguous between each portion of the sealing material that has been deposited onto the substrate and a corresponding one of the nozzles of the discharge device, and breaking a contiguous supply flow of the sealing material produces the at least one dangling thread portion.

3. The method of manufacturing a light emitting device according to claim 2, wherein a distance between the portion of the sealing material that has been deposited and the nozzles of the discharge device is increased to break the contiguous supply flow of the sealing material.

4. The method of manufacturing a light emitting device according to claim 2, wherein a projection is formed on each of the plurality of sealing members due to breaking the contiguous supply flow of the sealing material.

5. The method of manufacturing a light emitting device according to claim 1, wherein, prior to the step of forming the plurality of sealing members, a portion of the sealing material that is not for forming the sealing member is supplied to form a dangling thread portion dangling from at least one of the plurality of nozzles of the discharge device, and subsequently, the step of first forming step is started.

6. The method of manufacturing a light emitting device according to claim 1, wherein the plurality of nozzles of the discharge device are arranged in a circle.

7. The method of manufacturing a light emitting device according to claim 1, wherein the sealing material has a viscosity in a range of 180 Pa·s or greater and 260 Pa·s or less.

8. A method of manufacturing a light emitting device having a single light-emitting part, the method comprising:
    singulating the substrate having the plurality of sealing members, each covering a corresponding one of the plurality of the light sources obtained by the method according to claim 1.

* * * * *